United States Patent
Fisk, II et al.

(10) Patent No.: US 11,367,592 B2
(45) Date of Patent: *Jun. 21, 2022

(54) ADAPTIVE PERIODIC WAVEFORM CONTROLLER

(71) Applicant: MKS Instruments, Inc., Andover, MA (US)

(72) Inventors: Larry J. Fisk, II, Fairport, NY (US); Aaron T. Radomski, Conesus, NY (US); Jonathan W. Smyka, Rochester, NY (US)

(73) Assignee: MKS Instruments, Inc., Andover, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/905,377

(22) Filed: Jun. 18, 2020

(65) Prior Publication Data

US 2021/0013007 A1 Jan. 14, 2021

Related U.S. Application Data

(60) Continuation of application No. 16/273,595, filed on Feb. 12, 2019, now Pat. No. 10,727,027, which is a (Continued)

(51) Int. Cl.
*H01J 37/32* (2006.01)

(52) U.S. Cl.
CPC .... *H01J 37/32155* (2013.01); *H01J 37/3299* (2013.01); *H01J 37/32146* (2013.01); (Continued)

(58) Field of Classification Search
None
See application file for complete search history.

(56) References Cited

U.S. PATENT DOCUMENTS 4,977,529 A * 12/1990 Gregg ................ G05B 17/02
376/245
6,020,794 A 2/2000 Wilbur
(Continued)

FOREIGN PATENT DOCUMENTS

CN 101640969 A 2/2010
CN 104160789 A 11/2014
(Continued)

OTHER PUBLICATIONS

English translation of Chinese Office Action for Application No. 201910501067.6 dated Jan. 20, 2021.
(Continued)

*Primary Examiner* — Srinivas Sathiraju
(74) *Attorney, Agent, or Firm* — Harness, Dickey & Pierce, P.L.C.

(57) ABSTRACT

A repeating setpoint generator module selectively varies a setpoint for an output parameter according to a predetermined pattern that repeats during successive time intervals. A closed-loop module, during a first one of the time intervals, generates N closed-loop values based on N differences between (i) N values of the setpoint at N times during the first one of the time intervals and (ii) N measurements of the output parameter at the N times during the first one of the time intervals, respectively. An adjusting module, during the first one of the time intervals, generates N adjustment values based on N differences between (i) N values of the setpoint at the N times during a second one of the time intervals and (ii) N measurements of the output parameter at the N times during the second one of the time intervals, respectively.

20 Claims, 15 Drawing Sheets

Related U.S. Application Data continuation of application No. 16/005,761, filed on Jun. 12, 2018, now Pat. No. 10,217,609, which is a division of application No. 14/953,917, filed on Nov. 30, 2015, now Pat. No. 10,049,857.

(60) Provisional application No. 62/087,290, filed on Dec. 4, 2014.

(52) U.S. Cl.
CPC .. *H01J 37/32174* (2013.01); *H01J 37/32935* (2013.01); *H01J 2237/332* (2013.01); *H01J 2237/334* (2013.01)

(56) References Cited

U.S. PATENT DOCUMENTS

| | | | | |
|---|---|---|---|---|
| 6,417,732 | B1* | 7/2002 | Radomski | H03F 1/345 |
| | | | | 330/207 P |
| 6,700,092 | B2* | 3/2004 | Vona, Jr. | H05H 1/46 |
| | | | | 219/121.54 |
| 6,760,367 | B1 | 7/2004 | Smyka | |
| 7,728,602 | B2* | 6/2010 | Valcore | H01J 37/32944 |
| | | | | 324/536 |
| 7,785,374 | B2* | 8/2010 | Jones, Jr. | D06M 15/244 |
| | | | | 8/115.6 |
| 8,576,013 | B2 | 11/2013 | Coumou | |
| 8,581,597 | B2* | 11/2013 | Coumou | G01R 19/0061 |
| | | | | 324/536 |
| 8,582,552 | B2* | 11/2013 | Proctor, Jr. | H04W 52/0216 |
| | | | | 370/348 |
| 8,736,368 | B2* | 5/2014 | Irish | H02J 50/40 |
| | | | | 330/251 |
| 8,736,377 | B2* | 5/2014 | Rughoonundon | |
| | | | | H01J 37/32174 |
| | | | | 330/296 |
| 8,773,019 | B2* | 7/2014 | Coumou | H03G 1/00 |
| | | | | 315/111.21 |
| 8,781,415 | B1* | 7/2014 | Coumou | H01J 37/32183 |
| | | | | 455/114.3 |
| 8,890,537 | B2* | 11/2014 | Valcore, Jr. | H01J 37/32944 |
| | | | | 324/536 |
| 8,900,325 | B2* | 12/2014 | Herr | A61F 2/60 |
| | | | | 623/24 |
| 8,952,765 | B2* | 2/2015 | Fisk, II | H03F 3/20 |
| | | | | 332/149 |
| 9,136,093 | B2* | 9/2015 | Coumou | H01J 37/32174 |
| 9,196,459 | B2* | 11/2015 | Bhutta | H01J 37/244 |
| 9,306,533 | B1* | 4/2016 | Mavretic | G01R 27/28 |
| 9,336,995 | B2* | 5/2016 | Coumou | H01J 37/32155 |
| 9,408,288 | B2* | 8/2016 | Valcore, Jr. | H01J 37/32183 |
| 9,496,122 | B1* | 11/2016 | Bhutta | H01J 37/32091 |
| 9,509,266 | B2* | 11/2016 | Coumou | H03F 1/0233 |
| 9,525,412 | B2* | 12/2016 | Mavretic | H03K 17/687 |
| 9,536,749 | B2 | 1/2017 | Marakhtanov et al. | |
| 9,541,471 | B2* | 1/2017 | McCready | G01M 99/00 |
| 9,584,090 | B2* | 2/2017 | Mavretic | H01L 21/31138 |
| 9,648,716 | B2* | 5/2017 | Tran | H01J 37/32174 |
| 9,947,514 | B2 | 4/2018 | Radomski et al. | |
| 10,049,857 | B2* | 8/2018 | Fisk, II | H01J 37/32174 |
| 10,217,609 | B2* | 2/2019 | Fisk, II | H01J 37/32174 |
| 2004/0154637 | A1 | 8/2004 | Boyd et al. | |
| 2007/0107844 | A1* | 5/2007 | Bullock | H01J 37/3299 |
| | | | | 156/345.28 |
| 2008/0197854 | A1* | 8/2008 | Valcore | H01J 37/32944 |
| | | | | 324/500 |
| 2008/0201371 | A1 | 8/2008 | Murakami | |
| 2008/0204036 | A1* | 8/2008 | Iwasaki | G11C 29/50 |
| | | | | 324/537 |
| 2009/0026964 | A1 | 1/2009 | Knaus | |
| 2009/0200461 | A1 | 8/2009 | Raj et al. | |
| 2010/0141221 | A1* | 6/2010 | Ilic | H01J 37/32935 |
| | | | | 323/234 |
| 2010/0194195 | A1 | 8/2010 | Coumou et al. | |
| 2010/0201371 | A1* | 8/2010 | Valcore | H05H 1/0062 |
| | | | | 324/536 |
| 2014/0076713 | A1 | 3/2014 | Valcore, Jr. et al. | |
| 2014/0097908 | A1 | 4/2014 | Fisk, II et al. | |
| 2014/0118031 | A1 | 5/2014 | Rughoonundon et al. | |
| 2014/0136146 | A1 | 5/2014 | McCready | |
| 2014/0218076 | A1* | 8/2014 | Coumou | H01J 37/32174 |
| | | | | 327/141 |
| 2014/0306754 | A1 | 10/2014 | Coumou et al. | |
| 2014/0320013 | A1 | 10/2014 | Coumou et al. | |
| 2016/0163514 | A1* | 6/2016 | Fisk, II | H01J 37/3299 |
| | | | | 315/111.21 |
| 2019/0108976 | A1 | 4/2019 | Van Zyl | |

FOREIGN PATENT DOCUMENTS

| | | | | |
|---|---|---|---|---|
| EP | 1248343 | A2 * | 10/2002 | ........ H02M 3/33515 |
| EP | 1248353 | A2 * | 10/2002 | ........ H01J 37/32174 |
| EP | 1248357 | A2 * | 10/2002 | ................ H02J 3/00 |
| EP | 1750366 | A2 * | 2/2007 | .............. H03F 1/52 |
| EP | 1816670 | A2 * | 8/2007 | .............. H02H 3/04 |
| EP | 2611029 | A2 | 7/2013 | |
| WO | WO-2014070566 | A1 | 5/2014 | |
| WO | WO-2014123599 | A1 | 8/2014 | |

OTHER PUBLICATIONS

International Search Report for Application No. PCT/US2015/063421 dated Mar. 18, 2016.
International Preliminary Report on Patentability and Written Opinion of the International Searching Authority for International App. No. PCT/US2015/063421, dated Jun. 6, 2017.
Extended European Search Report for Application No. 15865151.3 dated Mar. 26, 2018.
English translation of Chinese Office Action for Application No. 2018042402138370 dated Apr. 27, 2018.
Extended European Search Report for European Patent App. No. 19165563.8 dated Sep. 12, 2019.
Written Opinion issued for Singapore Patent App. No. 10202002400W dated Sep. 14, 2020.
U.S. Appl. No. 62/087,290, filed Dec. 4, 2014, Larry J. Fisk.
U.S. Appl. No. 14/953,917, filed Nov. 30, 2015, Larry J. Fisk.
U.S. Appl. No. 16/273,595, filed Feb. 12, 2019, Larry J. Fisk.
U.S. Appl. No. 16/005,761, filed Jun. 12, 2018, Larry J. Fisk.
Written Opinion issued for Singapore Patent App. No. 10202002400W dated Oct. 15, 2021.
Extended European Search Report regarding EP 21157201.1, dated Jul. 9, 2021.

\* cited by examiner

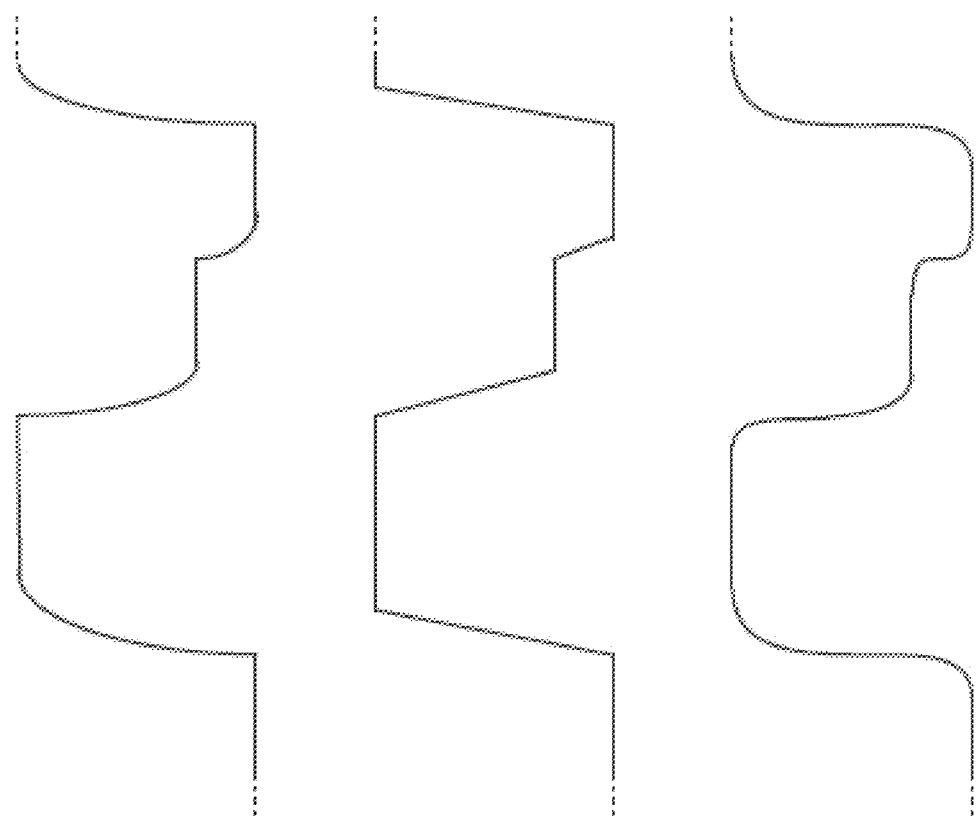

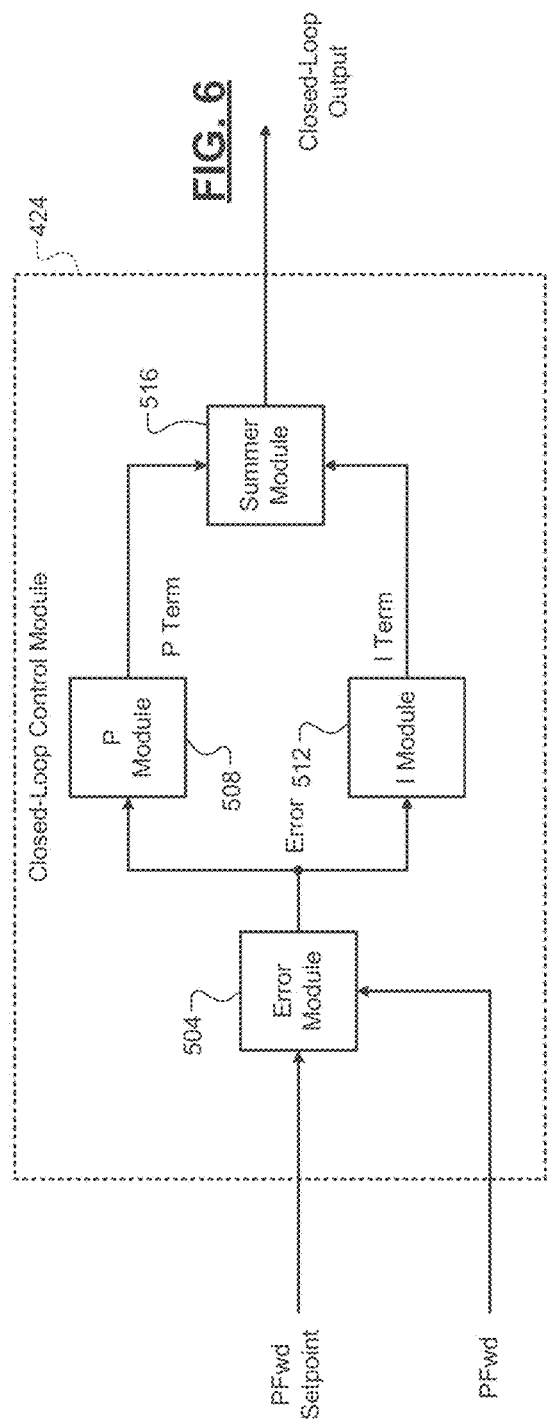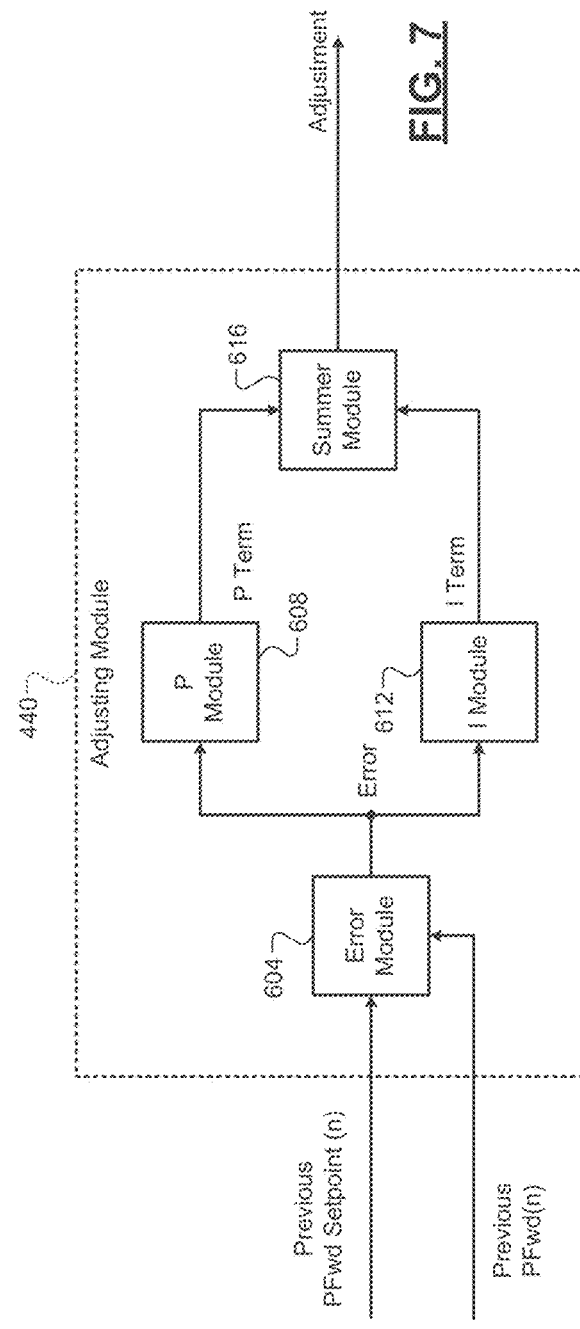

ADAPTIVE PERIODIC WAVEFORM CONTROLLER

CROSS REFERENCE TO RELATED APPLICATIONS

This application is a continuation of U.S. Continuation application Ser. No. 16/273,595, filed on Feb. 12, 2019, which is a continuation of U.S. Divisional application Ser. No. 16/005,761, filed on Jun. 12, 2018, which claims the benefit of U.S. application Ser. No. 14/953,917, filed on Nov. 30, 2015, which claims the benefit of U.S. Provisional Application No. 62/087,290, filed on Dec. 4, 2014. The entire disclosures of the above applications are incorporated herein by reference.

FIELD

The present disclosure relates to plasma chambers and to radio frequency (RF) generation systems and methods and more particularly to RF generators.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A radio frequency (RF) generator receives alternating current (AC) input power and generates an RF output. The RF output may be applied to, for example, a plasma electrode of a plasma chamber. Plasma chambers may be used in thin film manufacturing systems and other types of systems.

In some circumstances, a plasma chamber may include a plurality of plasma electrodes. For example only, more than one plasma electrode may be implemented where a surface area being treated is larger than an area that a single plasma electrode may be capable of servicing.

Accordingly, multiple RF generators may be employed in some circumstances. Each of the RF generators generates an RF output and applies the RF output to one of the plasma electrodes. The RF generators may be electrically connected in an effort to generate identical RF outputs.

SUMMARY

In a feature, a power output generation system is disclosed. A repeating setpoint generator module selectively varies a setpoint for an output parameter according to a predetermined pattern that repeats during successive time intervals. A closed-loop module, during a first one of the time intervals, generates N closed-loop values based on N differences between (i) N values of the setpoint at N times during the first one of the time intervals and (ii) N measurements of the output parameter at the N times during the first one of the time intervals, respectively. An adjusting module, during the first one of the time intervals, generates N adjustment values based on N differences between (i) N values of the setpoint at the N times during a second one of the time intervals and (ii) N measurements of the output parameter at the N times during the second one of the time intervals, respectively. The second one of the time intervals is the time interval immediately preceding the first one of the time intervals. A power amplifier applies an output power to a load. A mixer module generates N output values based on the N closed-loop values and the N adjustment values, respectively, and controls power input to the power amplifier based on the N output values.

In further features, the N times are equally spaced.

In further features, the N times are not equally spaced.

In further features, the closed-loop module generates the N closed-loop values using proportional-integral (PI) control.

In further features, the adjusting module generates the N adjustment values using proportional-integral (PI) control.

In further features, the mixer module generates the N output values further based on a mixing ratio, and the mixer module selectively varies the mixing ratio.

In further features, a frequency control module selectively adjusts a fundamental frequency of the power amplifier.

In further features, the frequency control module selectively adjusts the fundamental frequency of the power amplifier based on a reflected power.

In further features, the frequency control module selectively adjusts the fundamental frequency of the power amplifier based on a reflection coefficient.

In further features, the power amplifier applies the output to a plasma electrode.

In further features, a driver control module that determines a distortion of the output and selectively adjusts a fundamental frequency of the power amplifier based on the distortion.

In further features, the driver control module determines a first frequency adjustment based on the distortion and at least one previous amount of distortion of the output, determines a second frequency adjustment based on at least one previous amount of distortion of the output, and that sets the fundamental frequency of the power amplifier based on a previous switching frequency of the power amplifier, the first frequency adjustment, and the second frequency adjustment.

In further features, the driver control module determines the second frequency adjustment based on at least one previous value of the second frequency adjustment.

In a feature, a method of generating a power output is disclosed. The method includes: selectively varying a setpoint for an output parameter according to a predetermined pattern that repeats during successive time intervals; during a first one of the time intervals, generating N closed-loop values based on N differences between (i) N values of the setpoint at N times during the first one of the time intervals and (ii) N measurements of the output parameter at the N times during the first one of the time intervals, respectively; during the first one of the time intervals, generating N adjustment values based on N differences between (i) N values of the setpoint at the N times during a second one of the time intervals and (ii) N measurements of the output parameter at the N times during the second one of the time intervals, respectively, wherein the second one of the time intervals is the time interval immediately preceding the first one of the time intervals; applying, using a power amplifier, an output power to a load; generating N output values based on the N closed-loop values and the N adjustment values, respectively; and controlling power input to the power amplifier based on the N output values.

In further features, the N times are equally spaced.

In further features, the N times are not equally spaced.

In further features, generating the N closed-loop values comprises generating the N closed-loop values using proportional-integral (PI) control.

In further features, generating the N adjustment values comprises generating the N adjustment values using proportional-integral (PI) control.

In further features, the method further includes: generating the N output values further based on a mixing ratio; and selectively varying the mixing ratio.

In further features, the method further includes selectively adjusting a fundamental frequency of the power amplifier.

In further features, the method further includes selectively adjusting the fundamental frequency of the power amplifier based on a reflected power.

In further features, the method further includes selectively adjusting the fundamental frequency based on a reflection coefficient.

In further features, the method further includes applying, using the power amplifier, the output to a plasma electrode.

In further features, the method further includes: determining a distortion of the output; and selectively adjusting a fundamental frequency of the power amplifier based on the distortion.

In further features, the method further includes: determining a first frequency adjustment based on the distortion and at least one previous amount of distortion of the output; determining a second frequency adjustment based on at least one previous amount of distortion of the output; and setting the switching frequency of the power amplifier based on a previous fundamental frequency of the power amplifier, the first frequency adjustment, and the second frequency adjustment.

In further features, the method further includes determining the second frequency adjustment based on at least one previous value of the second frequency adjustment.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 5 includes graphs of example patterns that can be repeated within cycles/periods;

FIG. 6 includes a functional block diagram of an example closed-loop control module of an RF generator system;

FIG. 7 includes a functional block diagram of an example adjusting module;

In the drawings, reference numbers may be reused to identify similar and/or identical elements.

DETAILED DESCRIPTION

Figure 1:
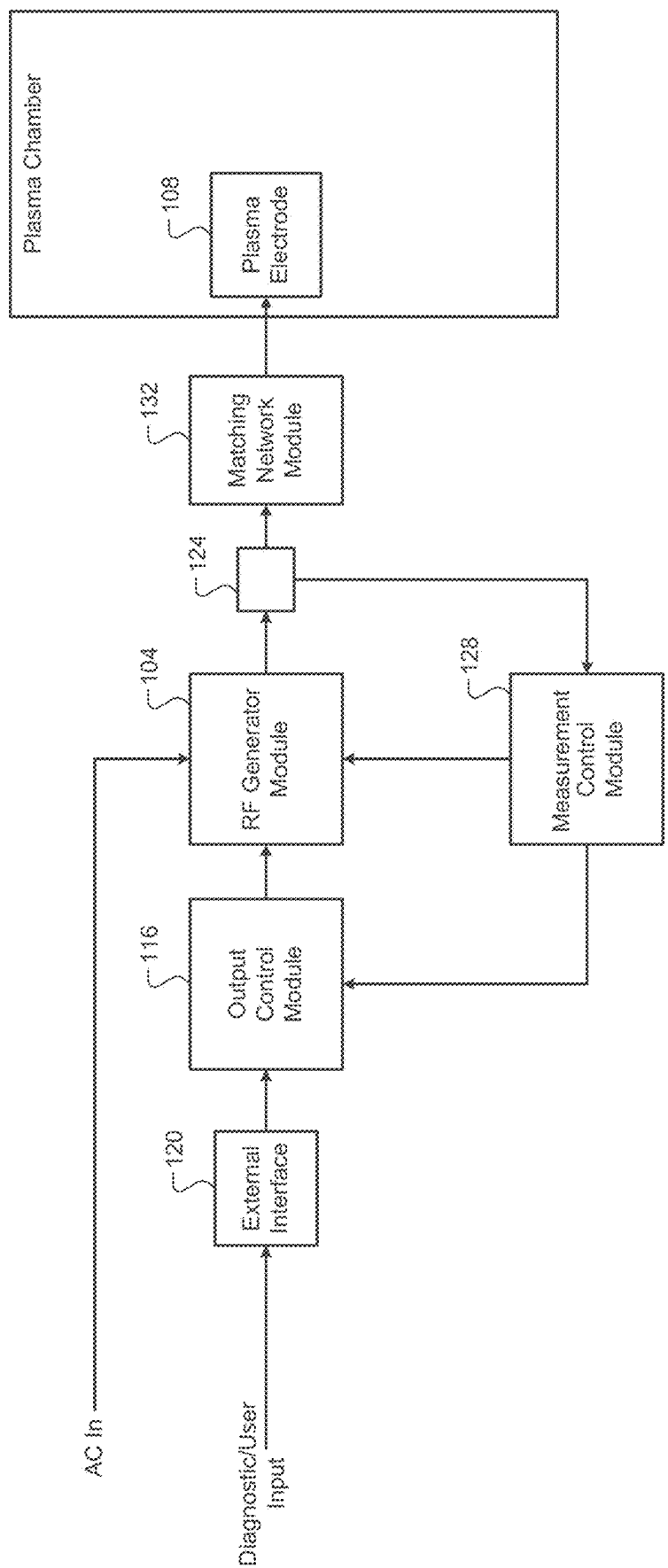
FIG. 1 is a functional block diagram of an example radio frequency (RF) plasma chamber control system.

Referring now to FIG. 1, a functional block diagram of an example radio frequency (RF) plasma chamber control system is presented. A radio frequency (RF) generator module 104 receives alternating current (AC) input power and generates an RF output using the AC input power. The RF output is applied to a plasma electrode 108 of a plasma chamber 112. In other types of systems, the RF output may be used differently. The plasma electrode 108 may be used, for example, in thin film deposition, thin film etching, and other types of systems.

An output control module 116 receives a power setpoint (P Set) for the RF output generated by the RF generator module 104 and that is delivered to the plasma electrode 108. The power setpoint may be provided, for example, via an external interface 120 or another suitable source. The external interface 120 may provide the power setpoint to the output control module 116, for example, based on a diagnostic or user input provided via a universal standard (US) RS-232 connection, via an Ethernet connection, via a fieldbus connection (e.g., Profibus, DeviceNet, Ethercat) via a wireless connection, or via a front panel interface. The setpoint may also be a voltage or current setpoint, depending on the plasma requirements.

An RF sensor 124 measures one or more parameters of the RF output and generates one or more sensor signals based on the measured parameter(s). For example only, the RF sensor 124 may include a voltage-current (VI) sensor, an RF probe, a directional coupler, a gamma sensor, a phase-magnitude sensor, or another suitable type of RF sensor.

A measurement control module 128 samples the sensor signal(s) at a predetermined sampling frequency. In various embodiments, the measurement control module 128 converts the (analog) samples into corresponding digital values. The measurement control module 128 also applies one or more signal processing functions to the digital values to produce processed values. The output control module 116 controls the RF generator module 104 to achieve the power setpoint. In various embodiments, a matching network module 132 may be included that provides matching. While the RF sensor 124 is shown as being upstream of the matching network module 132, in various embodiments, the RF sensor 124 may be located between the matching network module 132 and the load.

Figure 2:
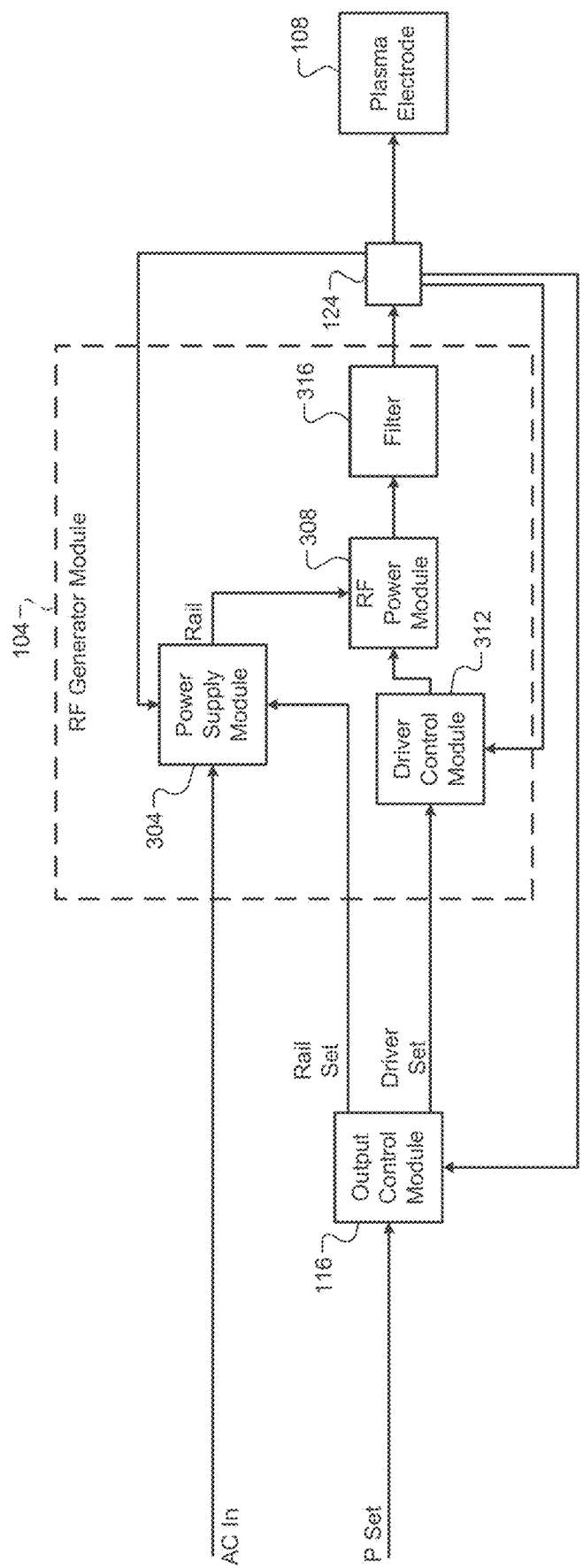
FIG. 2 is a functional block diagram of an example portion of the RF plasma chamber control system.

Referring now to FIG. 2, a functional block diagram including an example portion of the RF plasma chamber control system is presented. The output control module 116 may generate a rail voltage setpoint (Rail Set) and a driver control setpoint (Driver Set) based on the power setpoint. Based on the rail voltage setpoint, a power supply module 304 generates a rail voltage from the AC input power. The power supply module 304 applies the rail voltage to a RF power module 308. The RF power module 308 includes, for example, a driver module and a power amplifier. In various implementations, the output control module 116 may generate multiple phase-shifted driver signals for an outphasing amplifier topology.

A driver control module 312 drives the RF power module 308 based on the driver control setpoint. The driver control setpoint may indicate a target duty cycle (i.e., a percentage of ON time for each predetermined period). A filter 316 may be implemented to filter the harmonic output of the RF power module 308 (e.g., the power amplifier) before the RF output is applied to the plasma electrode 108. Outputs of one or more actuators of the RF system (e.g., power supply module 304, the driver control module 312) may be adjusted based on one or more parameters of the RF output measured by the RF sensor 124.

Figure 3:
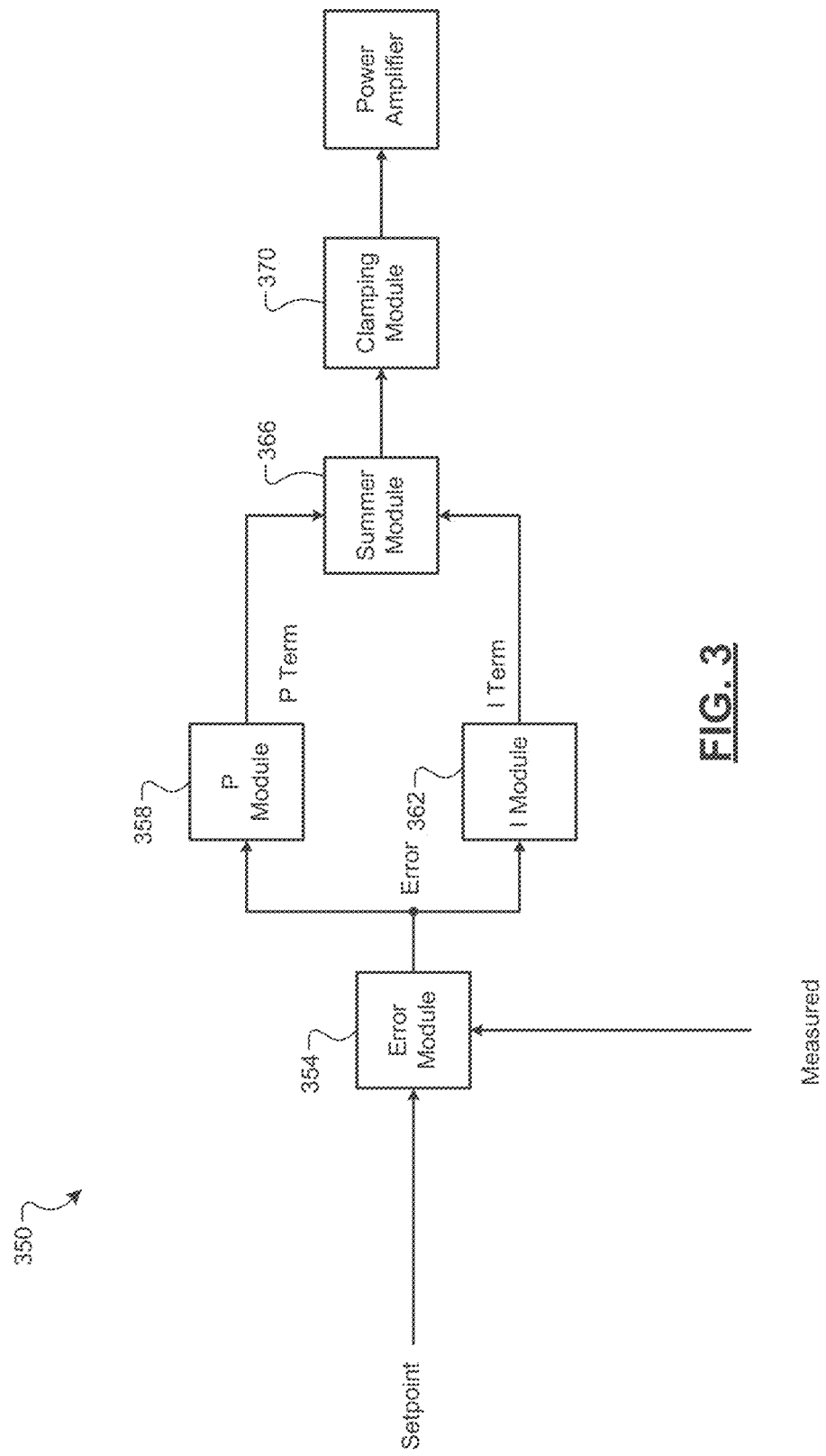
FIG. 3 is a functional block diagram of an example feedback control system.

Referring now to FIG. 3, a functional block diagram of an example feedback control system for an actuator (e.g., the plasma electrode 108) is presented. The feedback actuator control system of FIG. 3 could be used to generate, for example, a pulsed RF signal output, an envelope for a control or drive signal, or another suitable RF output. A pulsed RF signal output may refer to an output having repeating patterns including, but not limited to, equally spaced defined or arbitrary shaped patterns.

In a digital control system, which may also be referred to as a discrete time control system, the required closed-loop bandwidth of a controller able to produce a suitable pulsed RF envelope output would need to be at least two orders of magnitude greater than the period between the (same portions) of the cycles. Additionally, the group delays of sensors and actuators would need to be on the order of the controller sampling time. A suitable control system may therefore be complex and expensive.

In FIG. 3, a control module 350 includes an error module 354, a proportional (P) module 358, an integral (I) module 362, a summer module 366, and a clamping module 370. The error module 354 determines an error based on a difference between a setpoint for a parameter (e.g., the power setpoint) and a measured value of that parameter.

The proportional module 358 determines a P term value based on a proportional gain and the error value. The integral module 362 determines an I term value based on the error and an integral gain. The summer module 366 sums the P term value and the I term value to determine an output. The clamping module 370 may limit the output to within a predetermined range. The actuator (e.g., the power supply module, the driver amplitude, outphasing drive, etc.) is controlled based on the output. A control system including this control module, however, may be complex and expensive, as described above.

Another way to control the output based on the setpoint is described in commonly assigned U.S. Pat. No. 6,700,092 ("Vona"), the entire disclosure of which is incorporated herein. In Vona, a "holdoff time" or a delay period is used to jump in a discontinuous fashion from one pulse state to another. The controller is frozen during the holdoff time to allow the pulse amplitude to settle at the new value before transitioning to closed loop operation. In this configuration, a slower control loop bandwidth can be used than that described above in conjunction with FIG. 3. However, the use of the holdoff time may affect overshoot, rise time, and other responses.

The responses of Vona can be improved, for example, by ramping the output in open-loop towards the value where the amplitude will settle during the holdoff time. Such a configuration is described in commonly assigned U.S. Pat. No. 8,736,377 ("Rughoonundon"), the entire disclosure of which is incorporated herein. The ramping can be performed for multiple outputs/actuators, such as amplitude, frequency, etc. Rughoonundon provides better responses for rectangular pulses.

Figure 4:
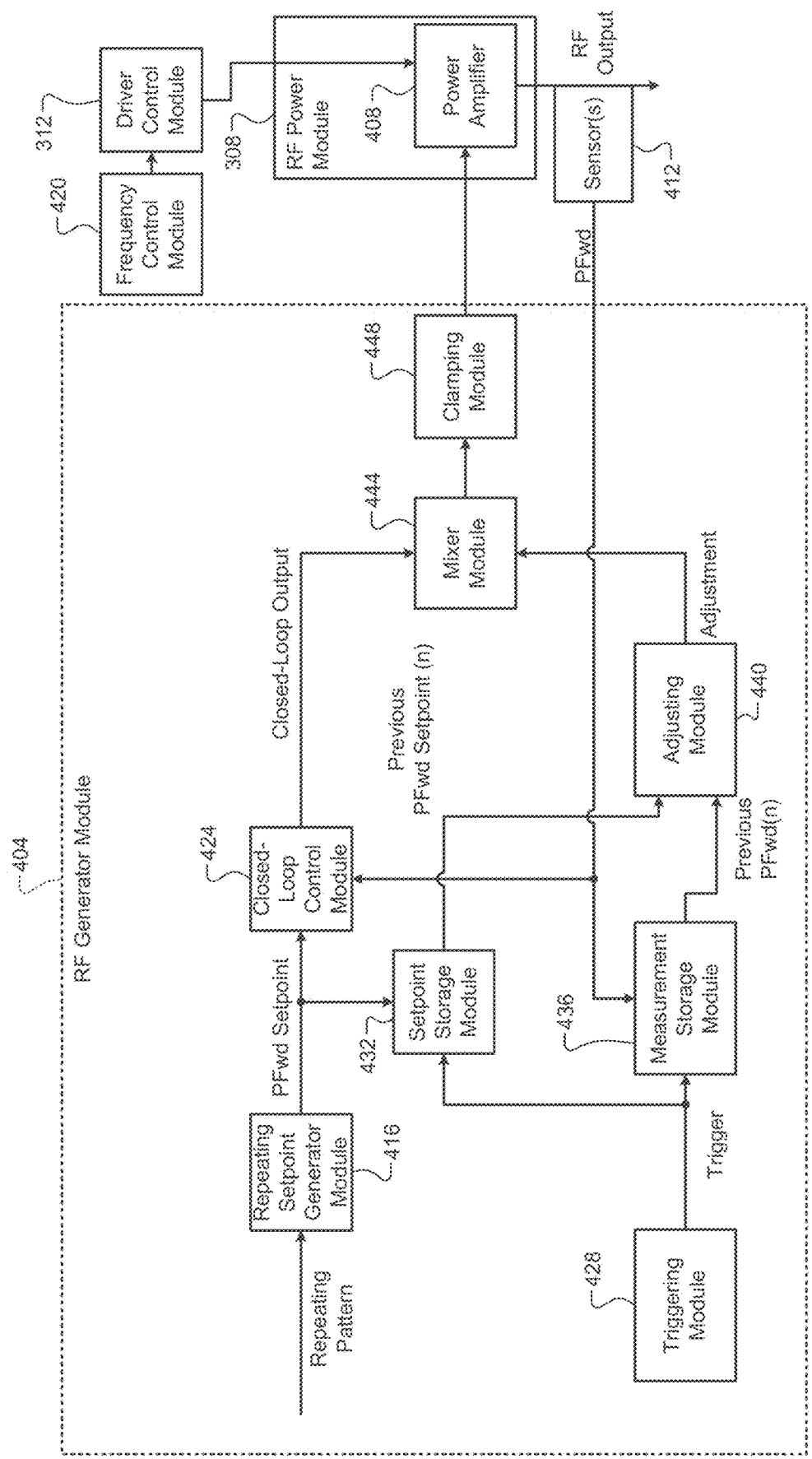
FIG. 4 is a functional block diagram of an example RF generator system.

FIG. 4 includes a functional block diagram of an example RF control system including an RF generator module 404, an RF power amplifier 408, and one or more sensors 412. The RF generator module 404 controls the power amplifier 408 to regulate RF output from the RF power amplifier 408, such as to a plasma electrode or another RF device. The RF power amplifier 408 may be a component of the RF power module 308 of FIG. 2.

A repeating setpoint generator module 416 generates forward power (PFwd) setpoints according to a repeating pattern within cycles or periods. A frequency control module 420 controls a fundamental RF frequency of the driver control module 312. The frequency control module 420 may vary the frequency, for example, to improve complex impedance matching and, therefore, decrease reflected power and a reflection coefficient. An envelope may define one or both (upper and lower) bounds of the output signal within a cycle/period.

The repeating pattern may be, for example, stored in memory. FIG. 5 includes three examples of patterns that may be repeated, however, other patterns may be used. In various implementations, the pattern used may be a non-standard, periodic pattern. Standard periodic patterns include, for example, sine waves, cosine waves, periodic pulses, triangular waves, etc. The frequency corresponds to the time period within the repeating pattern is performed once. The repeating setpoint generator module 416 varies the forward power setpoints according to one cycle of the pattern within each time period/cycle. While the example of forward power setpoints and forward power measurements will be discussed, the present application is also applicable to other RF setpoints and the corresponding measurements.

A closed-loop control module 424 generates a closed-loop output at a given time based on the forward power amplitude setpoint (sample) for that time and forward power amplitude (sample) measured by the sensor 412 for that time. More specifically, the closed-loop control module 424 generates the closed-loop output to adjust the forward power amplitude toward the forward power amplitude setpoint. A functional block diagram of an example of the closed-loop control module 424 is shown in FIG. 6. As stated above, while the example of forward power amplitude setpoints and forward power amplitude measurements will be discussed, the present application is also applicable to other RF setpoints and the corresponding measurements, such as voltage and/or current amplitude.

Referring now to FIG. 6, the closed-loop control module 424 includes an error module 504, a proportional (P) module 508, an integral (I) module 512, and a summer module 516. The error module 504 determines a forward power error based on a difference between the forward power setpoint at a time and the forward power measured using the sensor 412 at that time.

The proportional module 508 determines a proportional term (value) based on a predetermined proportional gain and the forward power error. The integral module 512 determines an integral term (value) based on a predetermined integral gain and the forward power error. The integral module 512 may limit (i.e., clamp) the integral term to within a predetermined range. The summer module 516 sums the P term and the I term to generate the closed-loop output. While the example of a PI closed-loop controller is shown and discussed, a P (proportional) closed-loop controller, a PID (proportional-integral-derivative) closed-loop controller, or another suitable type of closed-loop controller may be used.

Referring back to FIG. 4, the RF generator module 404 also includes a triggering module 428, a setpoint storage module 432, and a measurement storage module 436. The triggering module 428 generates a trigger signal N times during each cycle. N is an integer greater than 1. In one example, the triggering module 428 may generate the trigger signal 86 times during each cycle.

The triggering module 428 may generate the trigger signal in predetermined (time) intervals, or the interval between times when the trigger signal is generated may vary. In the case of different intervals between trigger signals, the triggering module 428 may, for example, generate the trigger signal more frequently near and when the forward power setpoint (and therefore the repeating pattern) changes. When the forward power setpoint is more steady, the triggering module 428 may generate the trigger signal less frequently. The triggering module 428 generates the trigger signal N number of times during each cycle and generates the trigger signal at the same N times during each cycle relative to the cycles' respective start and end. The closed-loop control module 424 may also update the closed-loop output each time that the trigger signal is generated.

The setpoint storage module 432 stores the present value of the forward power setpoint each time that the trigger signal is generated. When a cycle is completed, the setpoint storage module 432 has therefore stored N values of the forward power setpoint at the N times within that cycle. The measurement storage module 436 stores the present value of the forward power each time that the trigger signal is generated. When a cycle is complete, the measurement storage module 436 has therefore stored N values of the forward power at the N times within that cycle.

Each time that the trigger signal is generated at one of the N times, the setpoint storage module 432 and the measurement storage module 436 output the forward power setpoint and the forward power, respectively, stored for that one of the N times during the last cycle. The forward power setpoint from that time during the last cycle will be referred to as the previous forward power setpoint. The forward power measured at that time during the last cycle will be referred to as the previous forward power. In various implementations, the previous forward power can be a composite value determined based on multiple previous cycles. Such a composite value can be determined in various ways, such as using an Infinite Impose Response (IIR) filter. Use of such a composite value may reduce the effects of noise and plasma transient phenomena.

An adjusting module 440 generates an output adjustment at a given time based on the previous forward power setpoint for that time and the previous forward power measured by the sensor 412 for that time during the last cycle. A functional block diagram of an example of the adjusting module 440 is shown in FIG. 7.

Referring now to FIG. 7, the adjusting module 440 includes an error module 604, a proportional (P) module 608, an integral (I) module 612, and a summer module 616. The error module 604 determines a previous error based on a difference between the previous forward power setpoint at a time and the previous forward power at that time.

The proportional module 608 determines a proportional term (value) based on a predetermined proportional gain and the previous error. The integral module 512 determines an integral term (value) based on a predetermined integral gain and the previous error. The integral module 512 may limit (i.e., clamp) the integral term to within a predetermined range. The summer module 516 sums the P term and the I term to generate the output adjustment. The output adjustment at a time therefore reflects the closed-loop output at that time during the previous cycle.

While the example of a PI closed-loop controller is shown and discussed, a P (proportional) closed-loop controller, a PID (proportional-integral-derivative) closed-loop controller, or another suitable type of closed-loop controller may be used. Also, while storage of the previous forward power setpoint and the previous forward power is shown and discussed, the values of the error (determined by the error module 504) determined for the N times during a cycle may be stored and used for those N times, respectively, during the next cycle.

Referring back to FIG. 4, a mixer module 444 mixes the closed-loop output with the output adjustment to produce a final RF output. The mixer module 444 may mix the closed-loop output and the output adjustment, for example, based on a mixing ratio. The mixing ratio may be a predetermined value or may vary. For example, the mixer module 444 may vary the mixing ratio depending on desired behavior, such as load transient sensitivity or other rules, or may be set by another (e.g., higher level) controller. The mixing ratio may correspond to gains applied to the closed-loop output and the output adjustment such that, when the gain applied values are summed, result in the final RF output.

A clamping module 448 may limit (i.e., clamp) the final RF output to within the predetermined range. An actuator of the RF generator, such as the power amplifier/driver 408, is operated based on the final RF output to produce an RF output. The driver control module 312 controls a fundamental operating frequency of the power amplifier/driver 408. The fundamental operating frequency may also be referred to as the carrier frequency. The RF output may be applied, for example, to the plasma electrode 108 or another RF device.

Use of the adjusting module 440 improves response characteristics. For example, the adjusting module 440 may enable the forward power to more closely follow the forward power setpoint, may do so sooner (e.g., in a lesser number of cycles), and with less over and/or undershoot than, for example, an RF generator module implementing the system of FIG. 3. While the example of RF envelope outputs and setpoints has been shown and discussed, the present application is also applicable to other non-RF outputs, such as direct current (DC) outputs (involving repeating DC setpoints), and alternating current (AC) outputs (involving repeating AC setpoints). This approach may be increasingly effective in systems including one or more component modules having nonlinear transfer characteristics. In such systems, it may be difficult to use conventional linear control techniques when one or more subsystems exhibit gain expansion, gain compression, or clipping, such as that which may happen with RF power amplifiers. Plasma loads may also exhibit nonlinear behavior, such as load impedance that varies with applied power.

Figure 8:
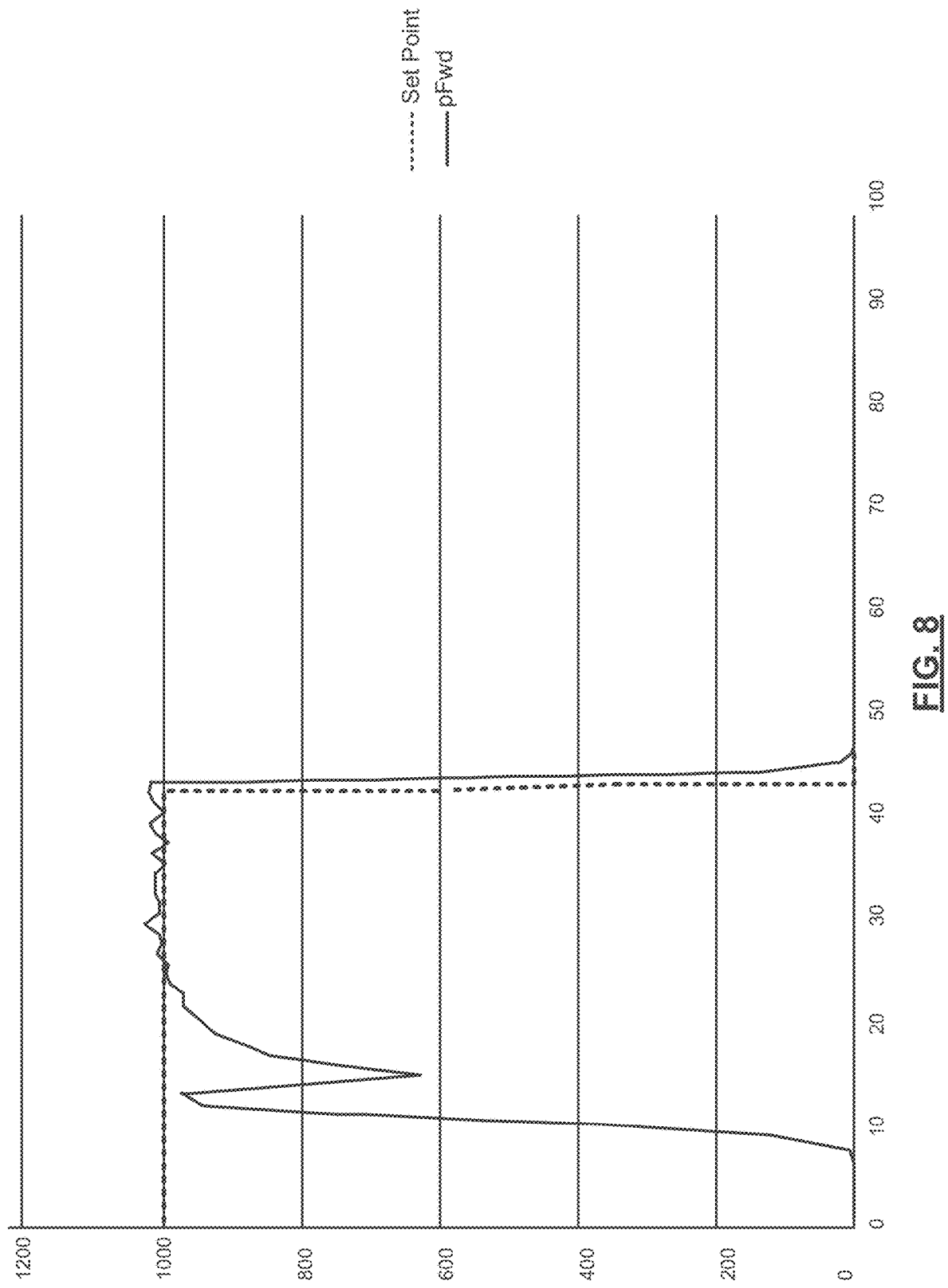
FIGS. 8-13 include graphs of setpoints and measurements versus time.
Figure 9:
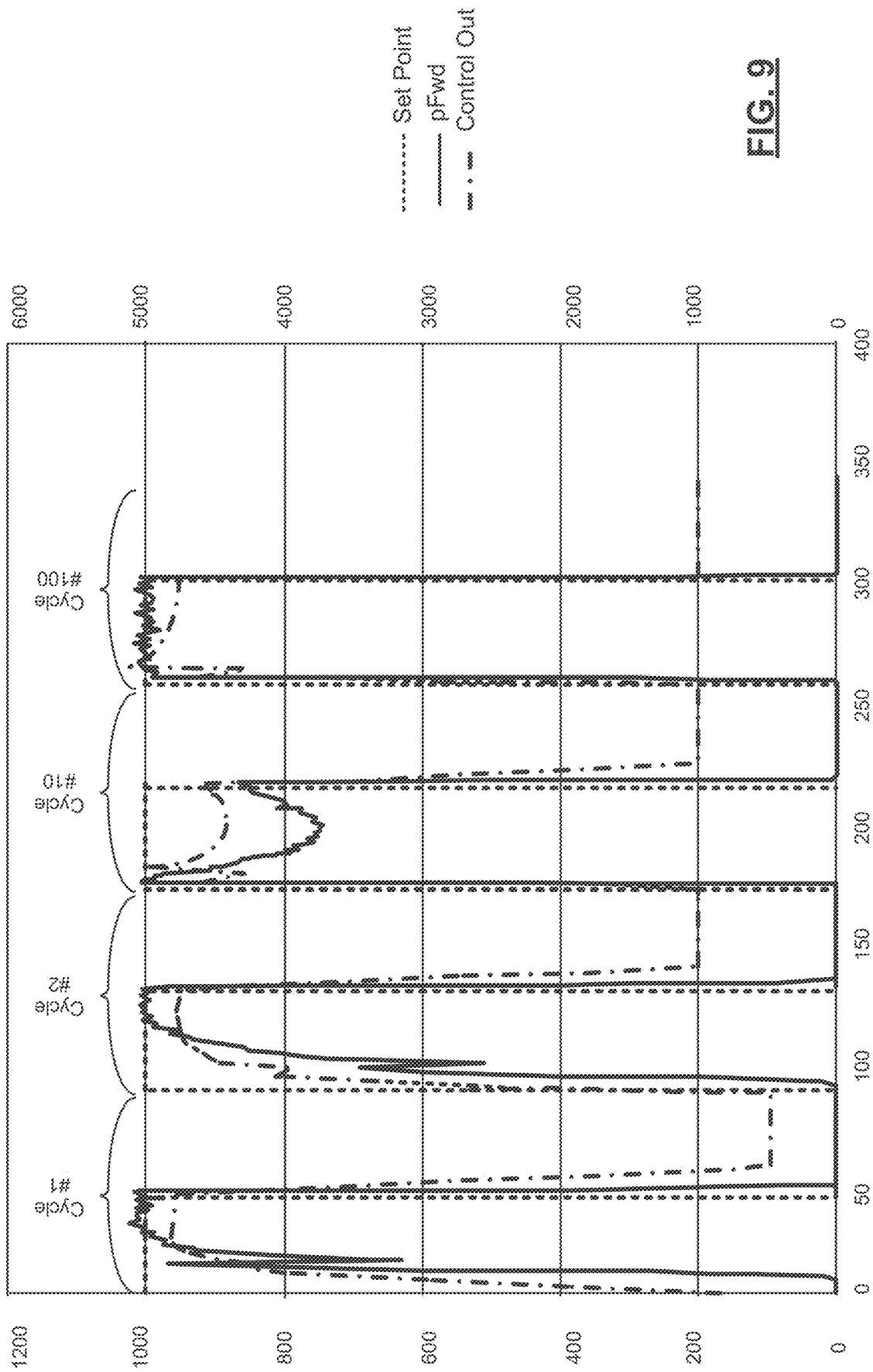
Figure 10:
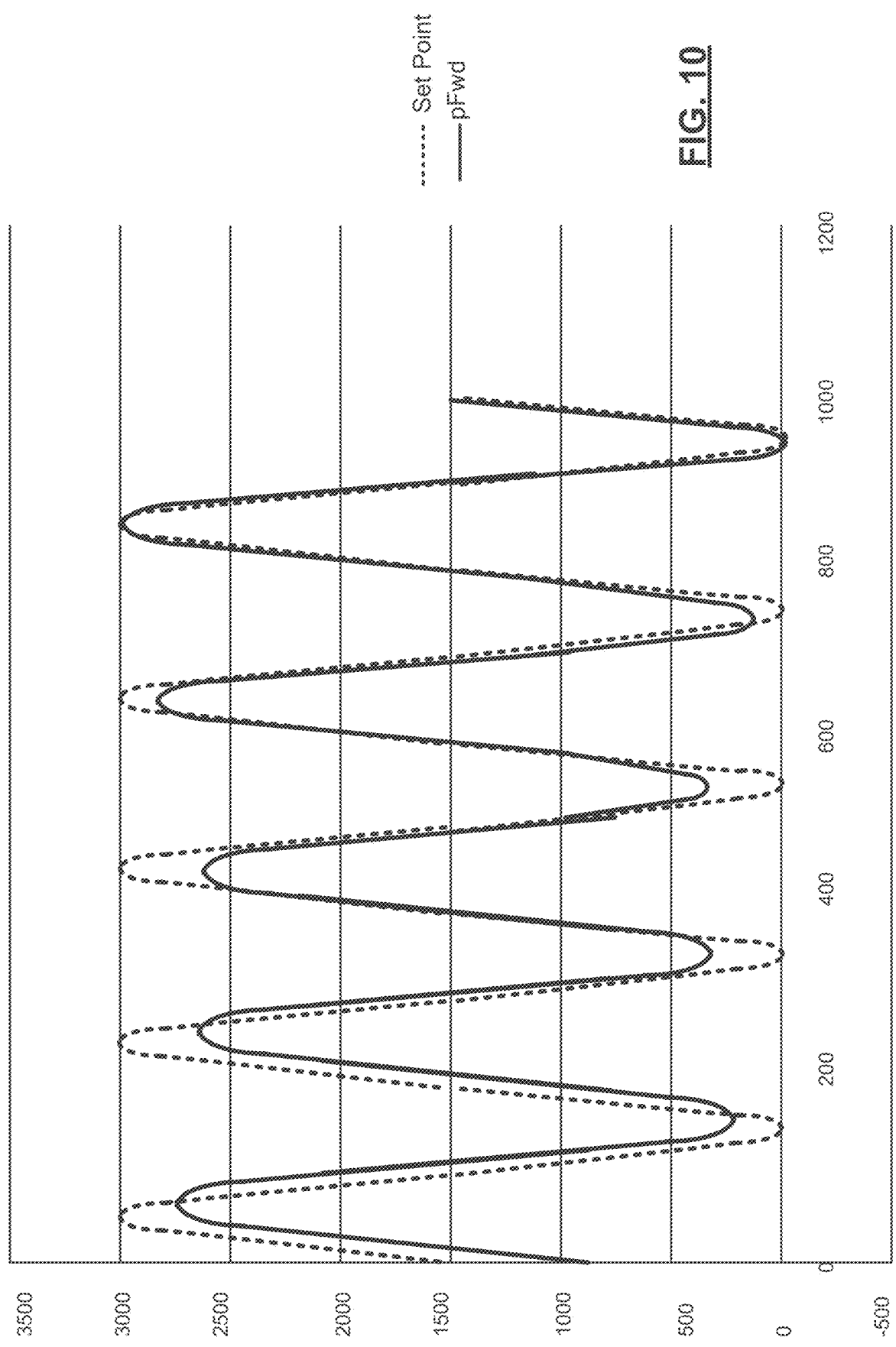
Figure 11:
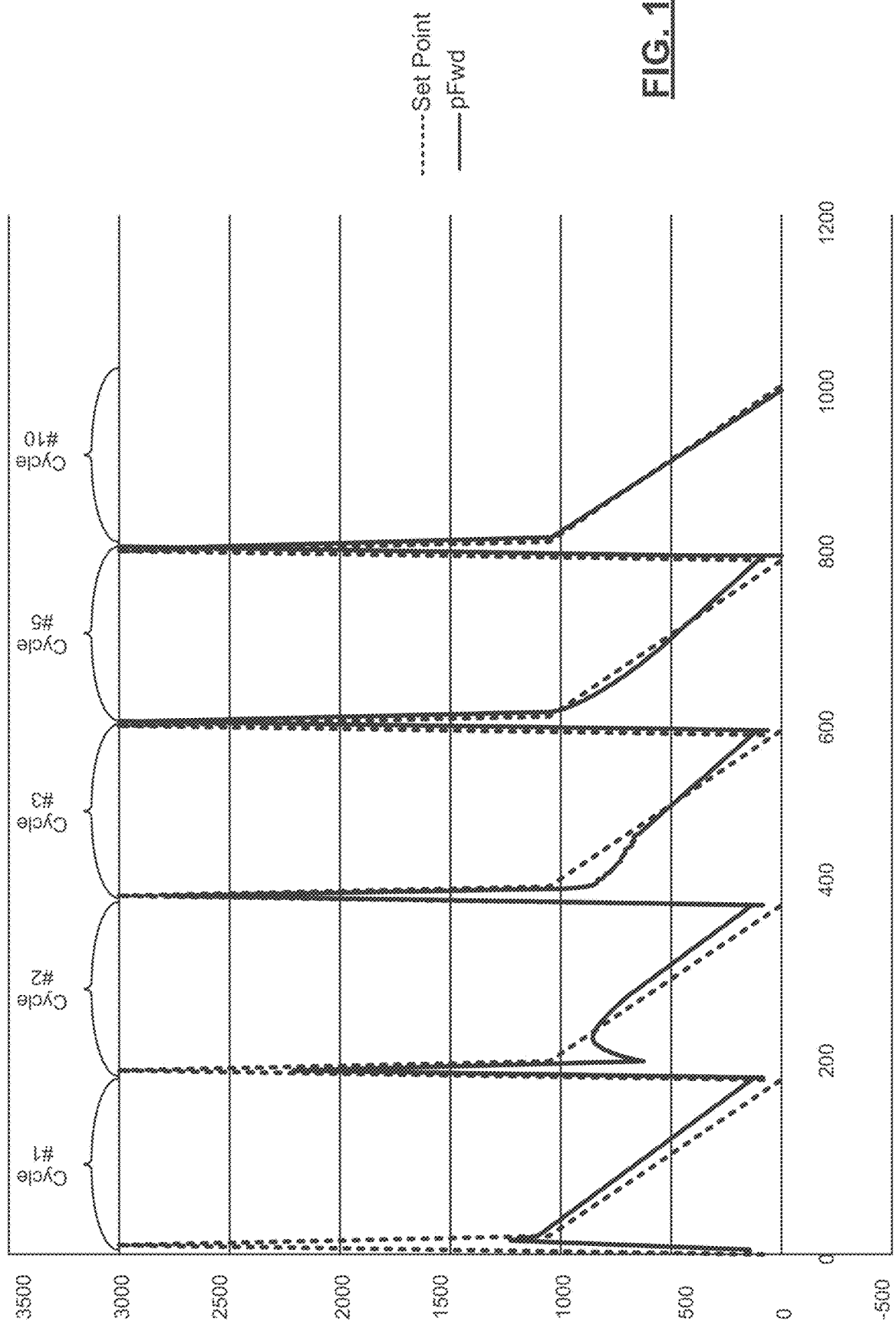
Figure 12:
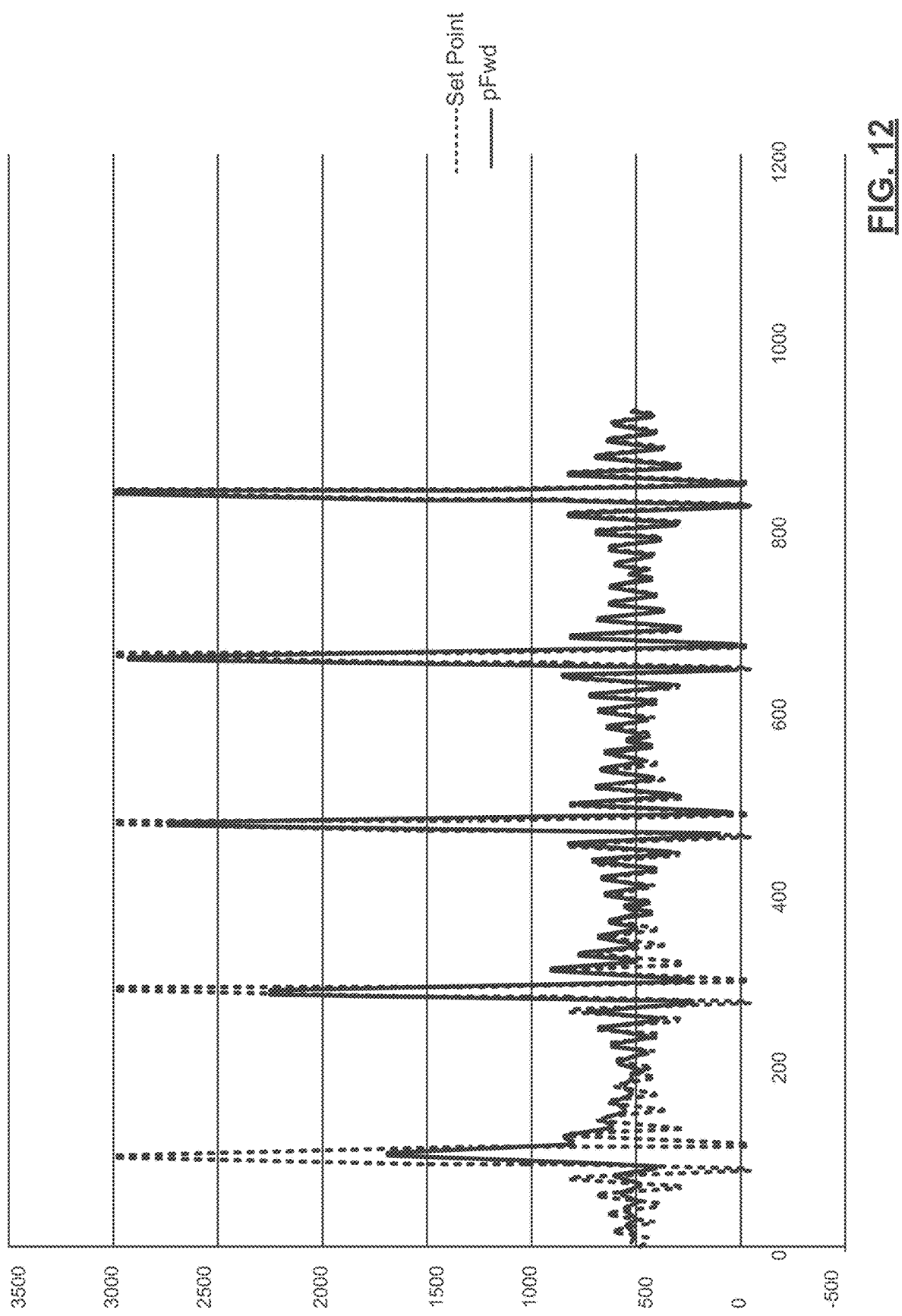
Figure 13:
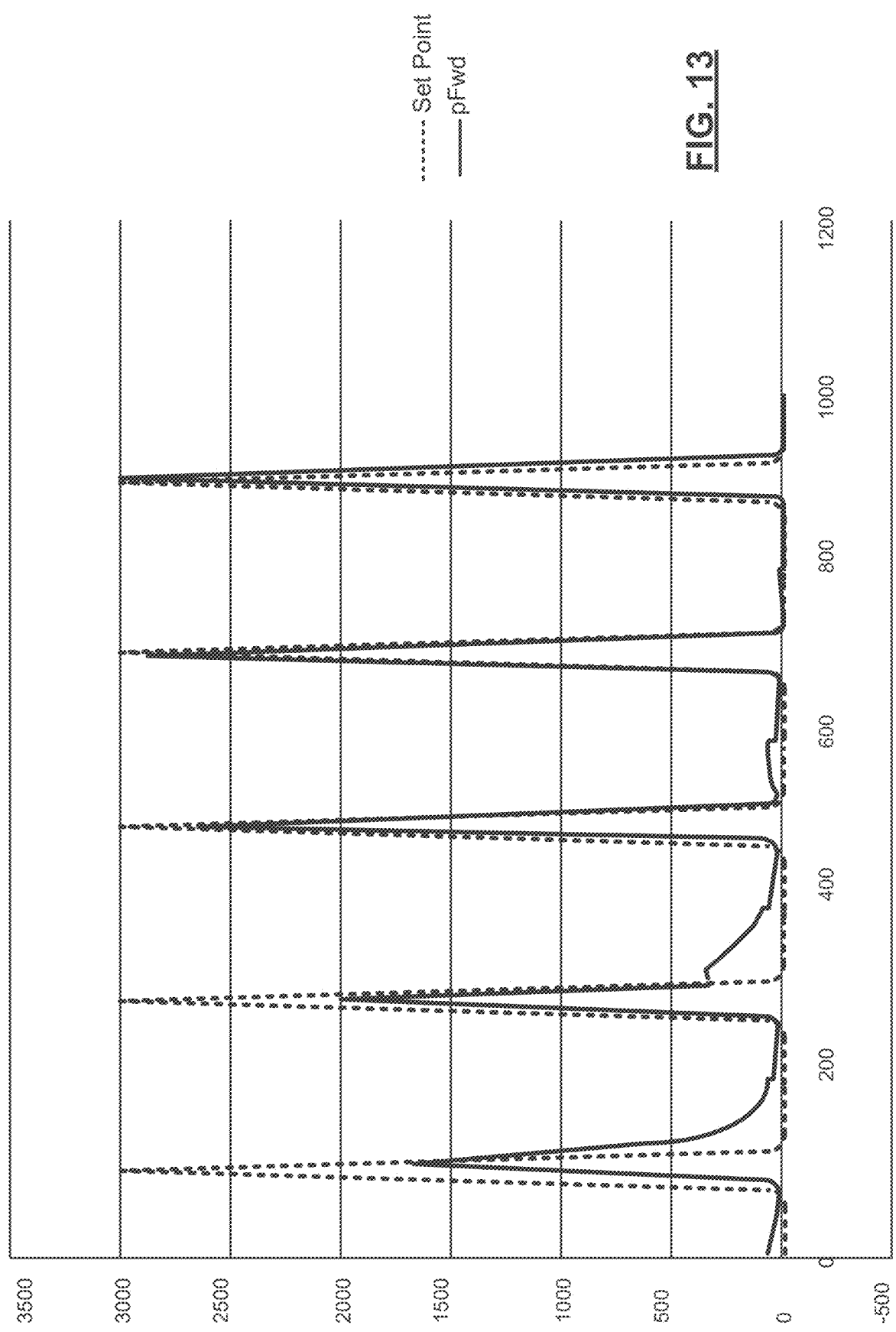

FIG. 8 includes an example graph of setpoints and measurements versus time during a first cycle for a setpoint set according to a repeating, predetermined shape. In the example of FIG. 8, the shape is a rectangular pulse or square wave. During the first cycle, no setpoints or measurements have been stored from one or more previous cycles. Thus, the output is controlled using only closed-loop feedback based on the differences between the setpoints and the measurements during that cycle. Differences between the measured and desired waveforms may be attributable to nonlinearities present in the power amplifier subsystems. After the first cycle, however, the previous setpoints and measurements are also used to control the output, and the measurements therefore more closely track the setpoints (e.g., see FIG. 9, cycles 1, 2, 10, and 100).

FIGS. 9-13 are example graphs illustrating this feature and include setpoints having various different repeating shapes. As shown in FIGS. 9-13, the measurements more closely track the setpoints during later cycles. From FIGS. 9-13, it can be seen that the control system described herein can be used to generate sinusoidal, square, or arbitrary shaped waveforms. The generated waveforms can define a primary signal, or the generated waveforms may define an envelope signal within which a drive signal operates. The drive signal and the envelope signal may be continuous waves or pulsed signals.

Figure 14:
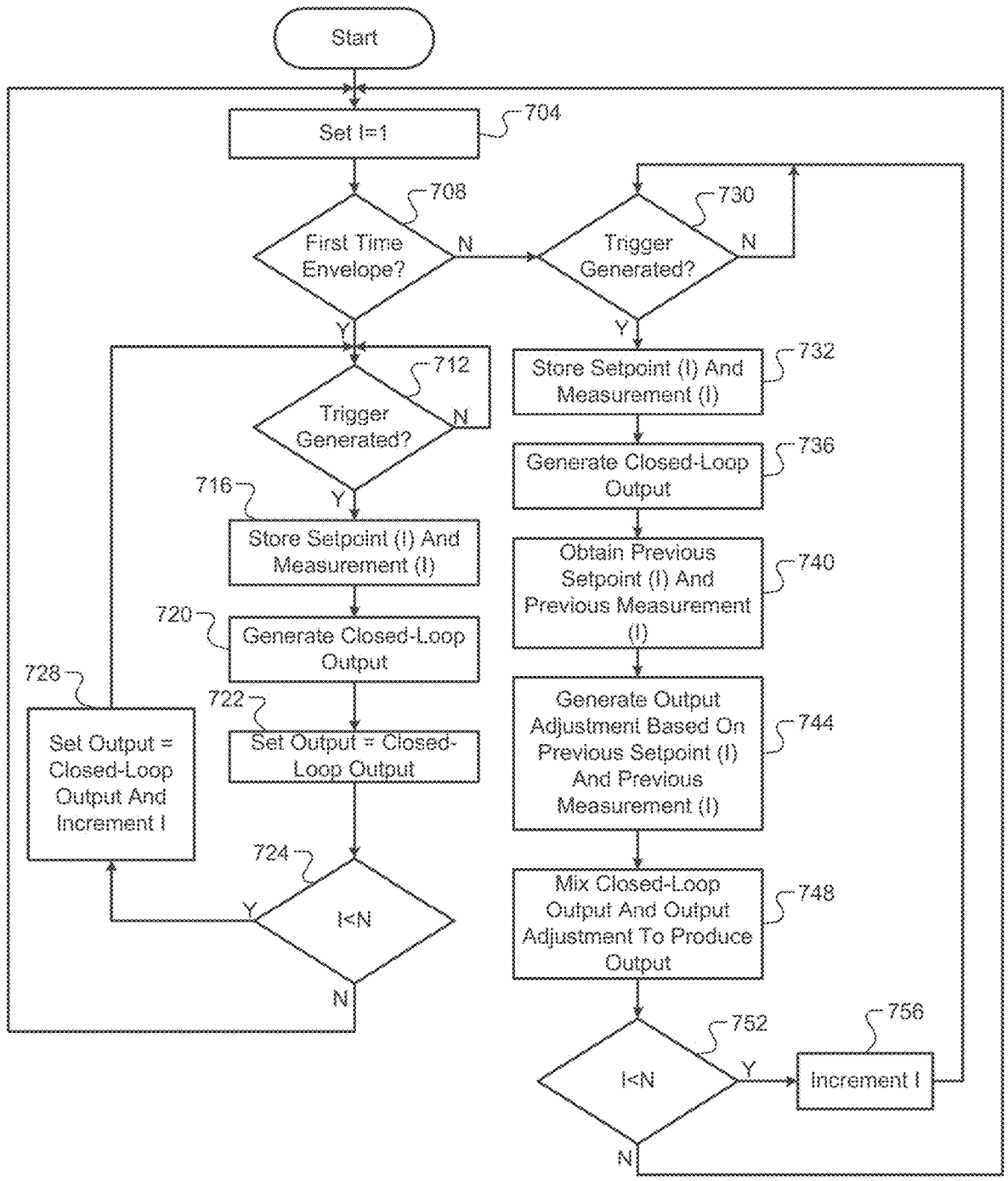
FIG. 14 includes a flowchart depicting an example method of controlling RF output.

FIG. 14 is a flowchart depicting an example method of controlling an output. Control begins with 704 where a counter value (I) is set to 1. At 708, it is determined whether the present cycle is a first cycle, for example, after a different repeating pattern was selected or after the unit is turned ON. If 708 is true, control continues with 712. If 708 is false, control transfers to 730, which is discussed further below.

At 712, the trigger signal is monitored, and a determination is made as to whether the trigger signal has been generated. When the trigger signal is generated, control continues with 716. When the trigger signal is not generated, control may remain at 712. At 716, the setpoint storage module 432 stores the I-th setpoint (e.g., forward power setpoint), and the measurement storage module 436 stores the I-th measured value (e.g., measured forward power). The closed-loop control module 424 determines the closed-loop output based on a difference between the I-th setpoint and the I-th measured value at 720. At 722, the mixer module 444 sets the output equal to the closed-loop output. An actuator, such as the power amplifier/driver 408, is controlled based on the output.

At 724, a determination is made as to whether the counter value (I) is less than a predetermined number (N). The predetermined number corresponds to the number of instances that the trigger signal is generated during each cycle. If 724 is true, the counter value (I) is incremented (e.g., I=I+1) at 728, and control returns to 712. If 724 is false, control returns to 704 to reset the counter value (I) to 1.

At 730, after the first cycle is complete, the trigger signal is monitored, and a determination is made as to whether the trigger signal is generated. When the trigger signal is generated, control continues with 732. When the trigger signal is not generated, control may remain at 730. At 732, the setpoint storage module 432 stores the I-th setpoint (e.g., forward power setpoint), and the measurement storage module 436 stores the I-th measured value (e.g., measured forward power). The closed-loop control module 424 determines the closed-loop output based on a difference between the I-th setpoint and the I-th measured value at 736.

At 740, the adjusting module 440 obtains the I-th setpoint from the last cycle and the I-th measurement from the last cycle. The adjusting module 440 generates the output adjustment at 744 based on a difference between the I-th setpoint from the last cycle and the I-th measurement from the last cycle. At 748, the mixer module 444 mixes the closed-loop output (determined at 736) with the output adjustment (determined at 744) to produce the output. As stated above, a actuator, such as the power amplifier/driver 408, is controlled based on the output.

At 752, a determination is made as to whether the counter value (I) is less than the predetermined number (N). The predetermined number corresponds to the number of instances that the trigger signal is generated during each cycle. If 752 is true, the counter value (I) is incremented (e.g., I=I+1) at 756, and control returns to 730. If 756 is false, control returns to 704 to reset the counter value (I) to 1.

Figure 15:
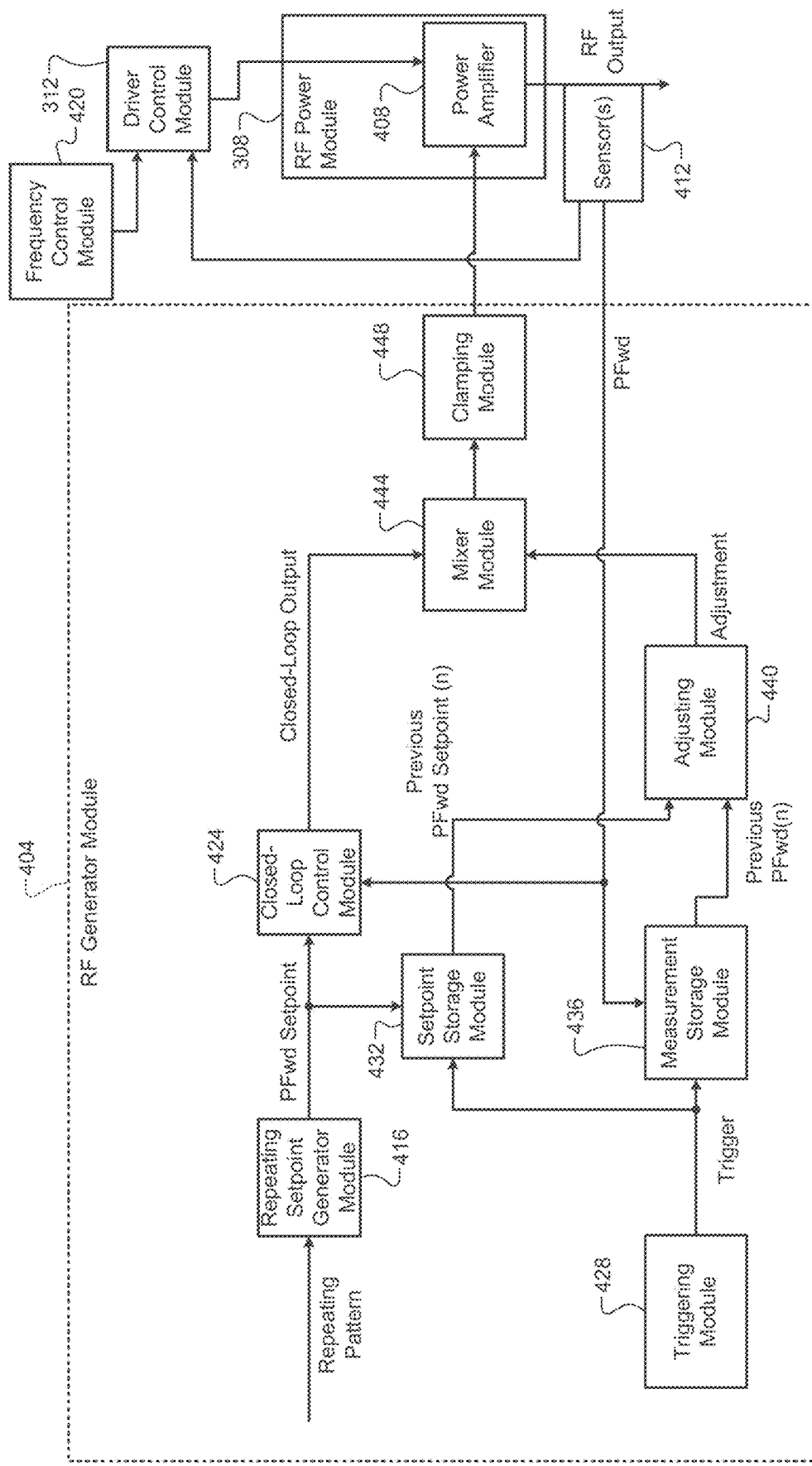
FIG. 15 is a functional block diagram of an example RF generator system.

FIG. 15 is a functional block diagram of an RF generation system. In addition to the control provided by the RF generator module 404, the driver control module 312 may control the fundamental RF operating frequency of the power amplifier/driver 408 based on one or more parameters measured by the sensor(s) 412. For example, the frequency can be adjusted to improve impedance matching of the RF power module 308 to the plasma load.

Figure 16:
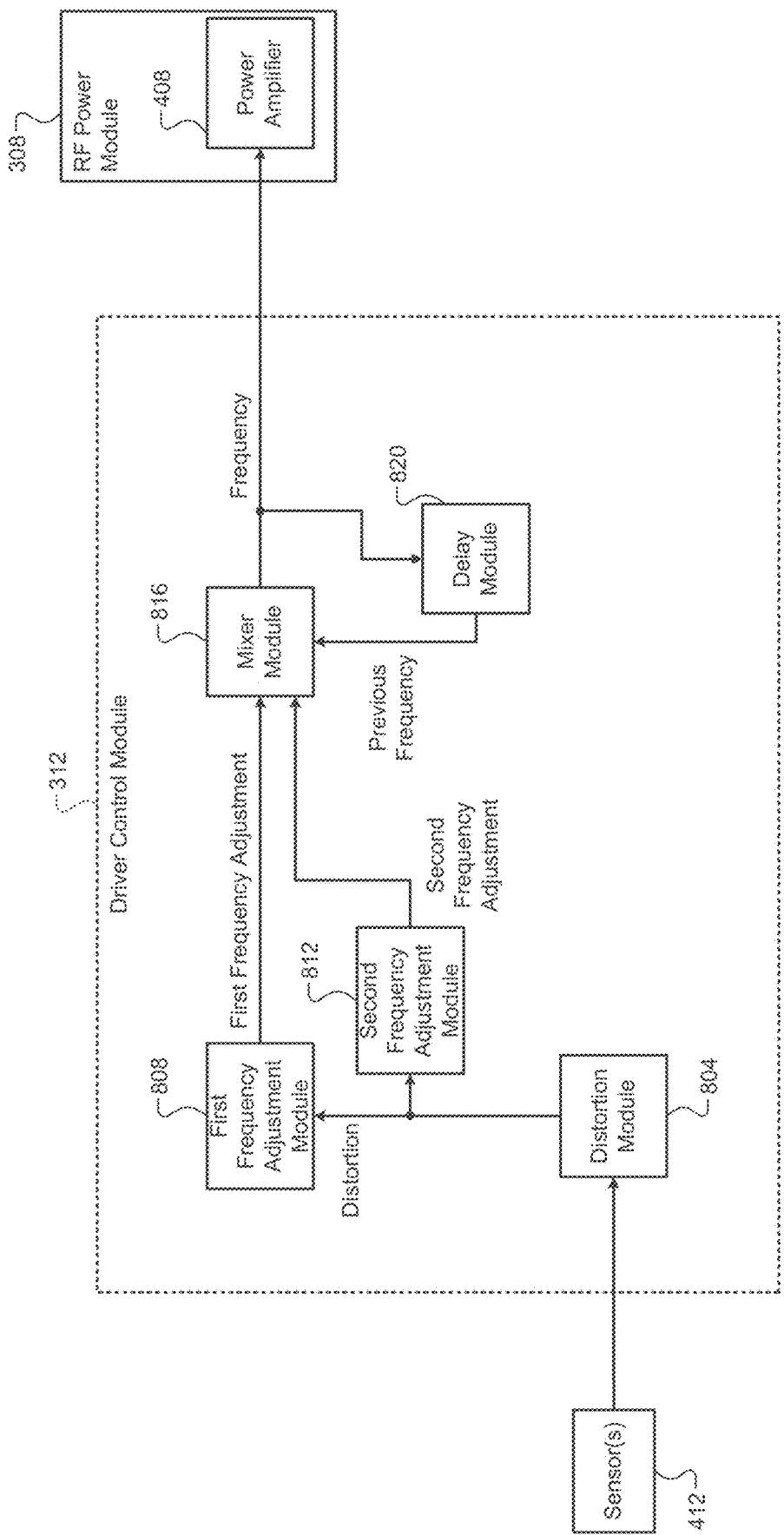
FIG. 16 is a functional block diagram of an example driver control module.

FIG. 16 is a functional block diagram of an example implementation of the driver control module 312. A distortion module 804 determines an amount of distortion in the RF output based on one or more parameters measured by the sensor(s) 412. The amount of distortion may correspond to an amount of reflected power and may be indicated, for example, by a reflection coefficient or reverse power.

First and second frequency adjustment modules 808 and 812 generate first and second frequency adjustments in an effort to minimize the distortion and, therefore, minimize reflected power. The first frequency adjustment module 808 generates the first frequency adjustment based on a present amount of distortion, one or more previous amounts of distortion from previous times, respectively, and one or more predetermined gain values. Examples of first frequency adjustments are described in commonly assigned U.S. Pat. Nos. 8,576,013, and 6,020,794, both of which incorporated herein in their entirety. The second frequency adjustment module 808 generates the second frequency adjustment based on one or more previous amounts of distortion from previous times, respectively, one or more previous values of the second frequency adjustment, and one or more predetermined gain values.

A mixer module 812 determines the fundamental operating frequency of the power amplifier/driver 408 based on a previous fundamental operating frequency of the power amplifier/driver 408, the first frequency adjustment, and the second frequency adjustment. For example, the mixer module 812 may set the fundamental operating frequency of the power amplifier/driver 408 to the previous fundamental operating frequency minus the first and second frequency adjustments. A delay module 820 provides the previous fundamental operating frequency after it has been stored for a predetermined period (e.g., one sampling period). The mixer module 812 may selectively vary gain values applied to the first and second frequency adjustments before the subtraction in various implementations.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

What is claimed is:

1. A power output generation system, comprising:
    a power amplifier configured to apply an output signal to a load;
    a RF generator module configured to control a shape of the output signal, wherein the RF generator module includes:
    a closed-loop module configured to, during a first time interval, generate a closed-loop signal based on the shape of the output signal and a measurement of a parameter during the first time interval, wherein the shape of the output signal varies in accordance with the parameter; and
    an adjusting module configured to, during the first time interval, generate an adjustment signal based on a shape of the output signal during a prior time interval and the parameter during the prior time interval, respectively.

2. The power output generation system of claim 1 wherein the parameter is at least one of current, voltage, forward power, reverse power, frequency, phase, gamma, or a reflection coefficient.

3. The power output generation system of claim 1 wherein the first time interval and the prior time interval are one of equally spaced or not equally spaced.

4. The power output generation system of claim 1 wherein at least one of the closed-loop module and the adjusting module is configured to generate the closed-loop signal and the adjustment signal using proportional-integral (PI) control, respectively.

5. The power output generation system of claim 1 further comprising a mixer module configured to generate an output signal based on the closed-loop signal and the adjustment signal, respectively, and configured to control power input to the power amplifier based on the output signal, the mixer module further configured to generate the output signal further based on a mixing ratio, and
wherein the mixer module selectively varies the mixing ratio.

6. The power output generation system of claim 1 further comprising a frequency control module configured to selectively adjust a fundamental frequency of the power amplifier.

7. The power output generation system of claim 6 wherein the frequency control module is configured to selectively adjust the frequency of the power amplifier based on one of a reflected power or a reflection coefficient.

8. The power output generation system of claim 1 further comprising a driver control module configured to determine a distortion of the output signal and configured to selectively adjust a frequency of the power amplifier based on the distortion.

9. The power output generation system of claim 8 wherein the driver control module is configured to determine a first frequency adjustment based on the distortion and at least one previous amount of distortion of the output signal, determine a second frequency adjustment based on at least one previous amount of distortion of an RF output, and that set the frequency of the power amplifier based on a previous frequency of the power amplifier, the first frequency adjustment, and the second frequency adjustment.

10. The power output generation system of claim 9 wherein the driver control module is configured to determine the second frequency adjustment based on at least one previous value of the second frequency adjustment.

11. A power output generation system, comprising:
a power amplifier configured to apply an output signal to a load;
a RF control module configured to control a shape of the output signal, wherein the RF control module includes:
a closed-loop module configured to, during a first time interval, generate a closed-loop signal based on the shape of the output signal and a measurement of at least one a first parameter and a second parameter during the first time interval, wherein the shape of the output signal varies in accordance with the at least one of the first parameter and the second parameter;
an adjusting module configured to, during the first time interval, generate an adjustment signal based on a shape of the output signal during a prior time interval and the at least one of the first parameter and the second parameter during the prior time interval, respectively; and
a second control module configured to, during the first time interval, generate a second signal based on the shape of the output signal and a measurement of the at least one of the first parameter and the second parameter during the first time interval, wherein the shape of the output signal varies in accordance with the at least one of the first parameter and the second parameter,
wherein the at least one of the first parameter and the second parameter are at least one of current, voltage, forward power, reverse power, frequency, phase, gamma, or a reflection coefficient.

12. The power output generation system of claim 11 wherein the first time interval and the prior time interval are one of equally spaced or not equally spaced.

13. The power output generation system of claim 11 wherein at least one of the closed-loop module and the adjusting module is configured to generate the closed-loop signal and adjustment signal using proportional-integral (PI) control, respectively.

14. The power output generation system of claim 11 further comprising a mixer module configured to generate an output signal based on the closed-loop signal and the adjustment signal, respectively, and configured to control power input to the power amplifier based on the output signal, the mixer module further configured to generate the output signal further based on a mixing ratio, and
wherein the mixer module is configured to selectively vary the mixing ratio.

15. The power output generation system of claim 11 further comprising a driver control module configured to determine a distortion of the output signal and selectively adjust at least one of the first parameter or the second parameter based on the distortion.

16. A power output generation system, comprising:
a power amplifier configured to apply an output signal to a load;
a RF control module configured to control a shape of the output signal, wherein the RF control module includes:
a closed-loop module configured to, during a first time interval, generate a closed-loop signal based on the shape of the output signal and a measurement of at least one a first parameter and a second parameter during the first time interval, wherein the shape of the output signal varies in accordance with the at least one of the first parameter and the second parameter;
an adjusting module configured to, during the first time interval, generate an adjustment signal based on a shape of the output signal during a prior time interval and the at least one of the first parameter and the second parameter during the prior time interval, respectively; and
a second control module configured to generate a second signal based on the shape of the output signal and a measurement of the at least one of the first parameter and the second parameter, wherein the shape of the output signal varies in accordance with the at least one of the first parameter and the second parameter,
wherein the at least one of the first parameter and the second parameter are at least one of current, voltage, forward power, reverse power, frequency, phase, gamma, or a reflection coefficient.

17. The power output generation system of claim 16 wherein the first time interval and the prior time interval are one of equally spaced or not equally spaced.

18. The power output generation system of claim 16 wherein at least one of the closed-loop module and the adjusting module is configured to generate the closed-loop signal and adjustment signal using proportional-integral (PI) control, respectively.

19. The power output generation system of claim 16 further comprising a mixer module configured to generate an output signal based on the closed-loop signal and the adjustment signal, respectively, and configured to control power input to the power amplifier based on the output signal, the mixer module further configured to generate the output signal further based on a mixing ratio, and
wherein the mixer module configured to selectively vary the mixing ratio.

20. The power output generation system of claim 16 further comprising a driver control module configured to determine a distortion of the output signal and to selectively adjust at least one of the first parameter or the second parameter based on the distortion.

\* \* \* \* \*